United States Patent [19]

Carr

[11] Patent Number: 4,567,430
[45] Date of Patent: Jan. 28, 1986

[54] SEMICONDUCTOR DEVICE FOR AUTOMATION OF INTEGRATED PHOTOARRAY CHARACTERIZATION

[75] Inventor: William N. Carr, Dallas, Tex.

[73] Assignee: Recognition Equipment Incorporated, Irving, Tex.

[21] Appl. No.: 705,843

[22] Filed: Feb. 26, 1985

Related U.S. Application Data

[63] Continuation of Ser. No. 299,759, Sep. 8, 1981, abandoned, which is a continuation of Ser. No. 68,828, Aug. 22, 1979, abandoned.

[51] Int. Cl.$^4$ ............................................. G01R 31/26
[52] U.S. Cl. ............................ 324/158 D; 324/158 R; 324/158 T
[58] Field of Search ............ 324/158 T, 158 R, 158 D; 357/30; 29/574

[56] References Cited

U.S. PATENT DOCUMENTS

| | | | |
|---|---|---|---|
| 3,518,494 | 6/1970 | James | 357/84 |
| 3,750,018 | 7/1973 | Leone et al. | 324/158 T |
| 3,845,295 | 10/1974 | Williams et al. | 357/30 |
| 4,194,213 | 3/1980 | Kano et al. | 357/24 |
| 4,200,892 | 4/1980 | Weimer | 357/30 |
| 4,241,262 | 12/1980 | Audaire et al. | 364/483 X |

FOREIGN PATENT DOCUMENTS

| | | | |
|---|---|---|---|
| 2624265 | 12/1977 | Fed. Rep. of Germany | 324/158 T |
| 54-159879 | 12/1979 | Japan | 29/574 |
| 57-173278 | 10/1982 | Japan | 357/30 |
| 2090057 | 6/1982 | United Kingdom | 29/574 |

OTHER PUBLICATIONS

Snow, E., et al., "Self-Scanned Charge Coupled Photodiode (CCPD) Sensor Arrays", SPIE, vol. 116, Solid State Imaging Devices, 1977, pp. 2–8.
Gagini, P., et al., "Dark-Currents Characterization in Charge-Coupled Devices", Solid-State and Electron Devices, vol. 2, No. 6, Nov. 1978, pp. 199–206.
Battista, M., "Test Vehicle for Semiconductor Surfaces", IBM Technical Disclosure Bulletin, vol. 13, No. 6, Nov. 1970, pp. 1433–1434.

Primary Examiner—Jerry W. Myracle
Assistant Examiner—Stephen M. Baker
Attorney, Agent, or Firm—Richards, Harris, Medlock & Andrews

[57] ABSTRACT

A semiconductor device structure is used to determine minority carrier lifetime and photosensitivity for production-processed integrated circuits and devices. The device structure family described herein permits determination of the minority carrier lifetime and photosensitivity at high throughput rates using automated test equipment in a normal test facility environment.

3 Claims, 8 Drawing Figures

SEMICONDUCTOR DEVICE FOR AUTOMATION OF INTEGRATED PHOTOARRAY CHARACTERIZATION

This application is a continuation of application Ser. No. 299,759, filed Sept. 8, 1981, now abandoned, which was a continuation of application Ser. No. 068,828, filed Aug. 22, 1979, now abandoned.

FIELD OF THE INVENTION

This invention relates to semiconductor devices and methods and more particularly to test devices and methods used for determining the photosensitivity of integrated circuits and devices.

BACKGROUND OF THE INVENTION

Determination of photosensitivity for integrated semiconductor photosensors is generally accomplished by measuring photocurrents in the presence of a photo-source. The testing of photosensitive integrated semiconductor circuits to production specifications has been accomplished heretofor using static test diodes or through actual dynamic operation of the full circuit. These previous testing procedures and devices have the disadvantage of requiring controlled and uniform photo illumination of the semiconductor photosensor. Such tests are inconvenient, time consuming, and difficult to conduct due to factors such a shadows created by the automated slice probe system.

SUMMARY OF THE INVENTION

The semiconductor devices embodied in the present invention use special structures which permit a determination of parameters correlating with the photosensitivity of photosensors on the same semiconductor wafer in proximity to the semiconductor devices without regard to the ambient photo illumination of the device. Minority carrier transport is measured for determination of the minority carrier lifetime and photosensitive characteristic of the semiconductor wafer and/or the devices thereon. Measurements may be made both in a darkroom and normal test facilities with ordinary illumination conditions. Measurements may be made at high speeds with automated test probe equipment; and the device is compatible with present day integrated circuit methods including MOS, CCD and IIL and standard bipolar techniques.

BRIEF DESCRIPTION OF THE DRAWINGS

The features and technical advance of the invention will be better understood by the following description taken in conjunction with the drawings wherein.

Figure 1B:
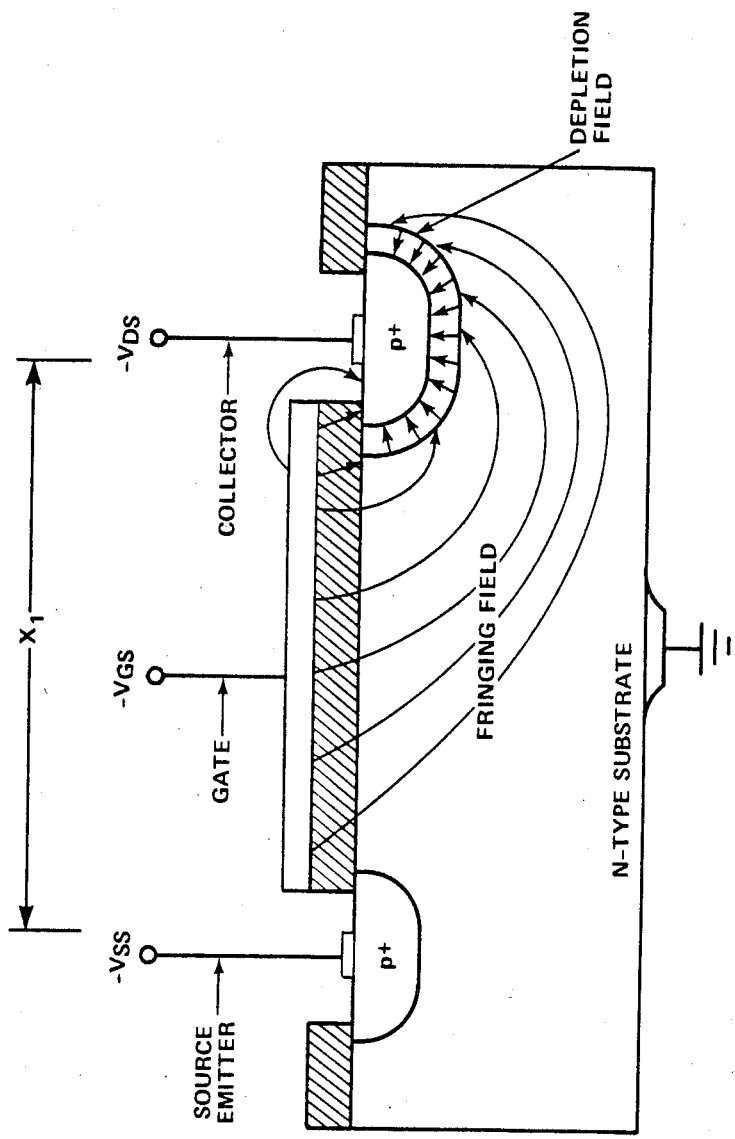
FIG. 1b is a pictorial representation of the physical structure of the test device.

Operation and specific examples of the present invention is best prefaced with a theory of photodevice operation. The basic photodevice used in semiconductor photodiode arrays is a p-n junction near the semiconductor surface with ohmic contacts to the diode areas, together with appropriate voltage bias circuitry. The current-voltage characteristic curve for the diode follows the classical diode equation.

$$I = I_o [\exp(qV_F/kT) - 1)] - I_\lambda \qquad (1)$$

Where $$I_o = n_i^2 \left( \frac{1}{N_A} \sqrt{\frac{D_n}{\tau_n}} + \frac{1}{N_D} \sqrt{\frac{D_p}{\tau_p}} \right) \qquad (2)$$

and $I_\lambda = qG_\lambda A_j$ photocurrent generation near diode active area $A_j$. The parameters $\tau_n$ and $\tau_p$ are electron and hole lifetimes, respectively. Other parameters are standard semiconductor physics notation.

The hole-electron pair generation rate G for incident photons penetrating distance x into the semiconductor in the vicinity of said diode is given by $$G(x) = \Phi \cdot \alpha \exp(-\alpha x) \qquad (3)$$

Where $\Phi \cdot$ is the incident light flux denxity (photons/cm$^2$), and $\alpha$ is the optical absorption coefficient (cm$^{-1}$). The number of minority carriers M that diffuse a distance x to the p-n junction at x=d from photoabsorption sites is given by $$M(d) = G(x) \exp \frac{|d - x|}{L} \qquad (4)$$

The resultant photocurrent is expressed as $$I_\lambda = q\Phi_0 \alpha A_j \left( \frac{L_n \exp(-d/L_n)}{\alpha L_n - 1} \left[ \exp - \left( \frac{\alpha L_n - 1}{L_n} \right) d - 1 \right] + \frac{L_p \exp(-d/L_p)}{\alpha L_p - 1} (\exp - \alpha d) \right) \qquad (5)$$

where $$I_\lambda = qM(d)A_j.$$

The photocurrent $I_\lambda$ is the factor determining the photosensitivity of similarly processed photodiode devices on the same semiconductor substrate.

The theory of lateral PNP measurements for photocorrelation may be defined as follows. The photoresponse of the diffused diode for carriers originating at a distance $x_1$ into the bulk $x_1 > d$ is obtained from Equation 4 as $$M(d) = \alpha G(x_1) \exp(-x_1/L_p) \qquad (6)$$

with a photocurrent of $$I_\lambda = qG(x_1)A_j \exp(-x_1/L_p) \qquad (7)$$

It is possible to use an existing test MOS transistor geometry to emulate the collection effect of Equation 7. If one selects a transistor geometry shown in FIG. 1b with sufficient source to collector spacing $x_1$ the overall device function can be made to match the situation of Equation 7. The source diode forward biased, FIG. 1a, serves as a source of holes to emulate the photogeneration function G(x). The collector diode reverse biased serves as a photodiode and the depletion field collects the equivalent photogeneration G(x) from the source junction. When the source-to-drain distance $x_1$ is made sufficiently large, and where fringing electric fields are minimized, the device connected according to FIG. 1a provides a static collector current of $$I_C = qJ_E A_j \exp(-x_1/L_p) \quad (8)$$

where $J_E$ is the injected current density and source of holes at the forward biased emitter.

$$J_E = \frac{I_S}{A_j} \left( 1 + \sqrt{\frac{N_n D_n L_n}{N_p D_p L_p}} \tanh \frac{X_1}{L_p} \right)^{-1} \quad (9)$$

For situations at low level with a heavily doped source boron diffusion the injection current can be considered as completely due to hole injection, and thus $$J_E = I_S/(10) \quad$$

Figure 1A:
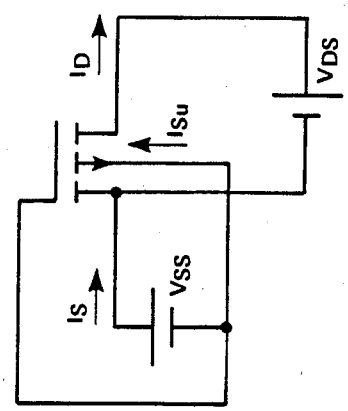
FIG. 1a is a circuit diagram of a test device.

The overall transfer of the FIG. 1b device connected as FIG. 1a yields $$I_C = I_S \exp(-x_1/L_p) \quad (11)$$

Lifetime in the bulk n-type silicon is $$L = \sqrt{D_p \tau_p}$$

which can be calculated based on the simplified relationship of Equation 12

$$I_C = I_S \exp(-x_1/\sqrt{D_p \tau_p}) \quad (12)$$

with the result $$\tau_p = (x_1^2/D_p)/(\log I_C/I_S)^2 \quad (13)$$

The simplified relation becomes inaccurate for geometrics with large $V_{DS}$ and small $X_1$ separation values. The experimental data obtained for test geometry with $X_1 \approx 0.35$ mils is given if FIG. 2. The ratio of $I_C/I_S = h_{FE}$ is plotted in FIG. 2 for nanoamp levels of injection current $I_S$ increasing to the levels where field-aided diffusion of holes dominates the collector current $I_C$.

Figure 3:
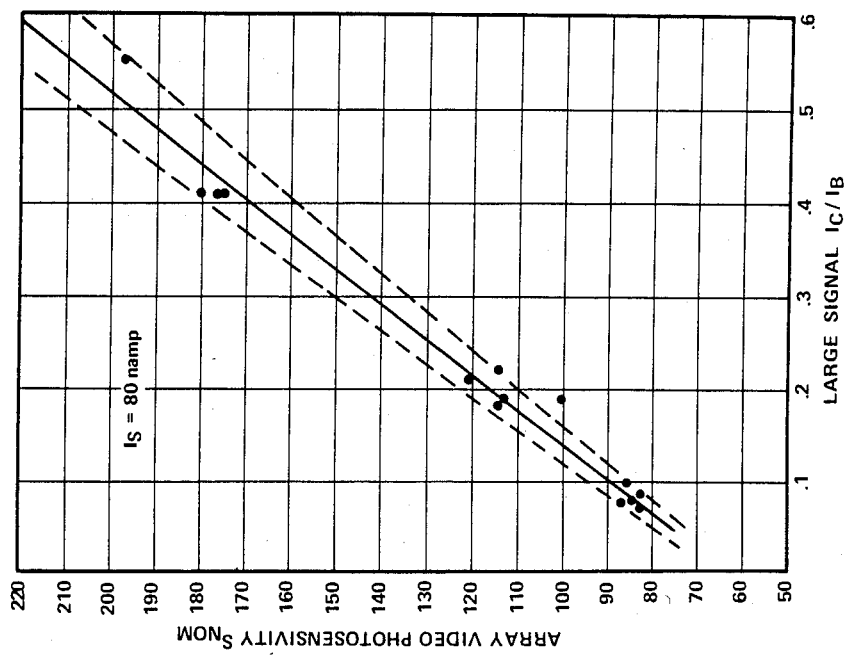
FIG. 3 is an array of a dynamic video photosensitivity $S_{NOM}$ plotted as a function of lateral gain $h_{FE}$.
Figure 2:
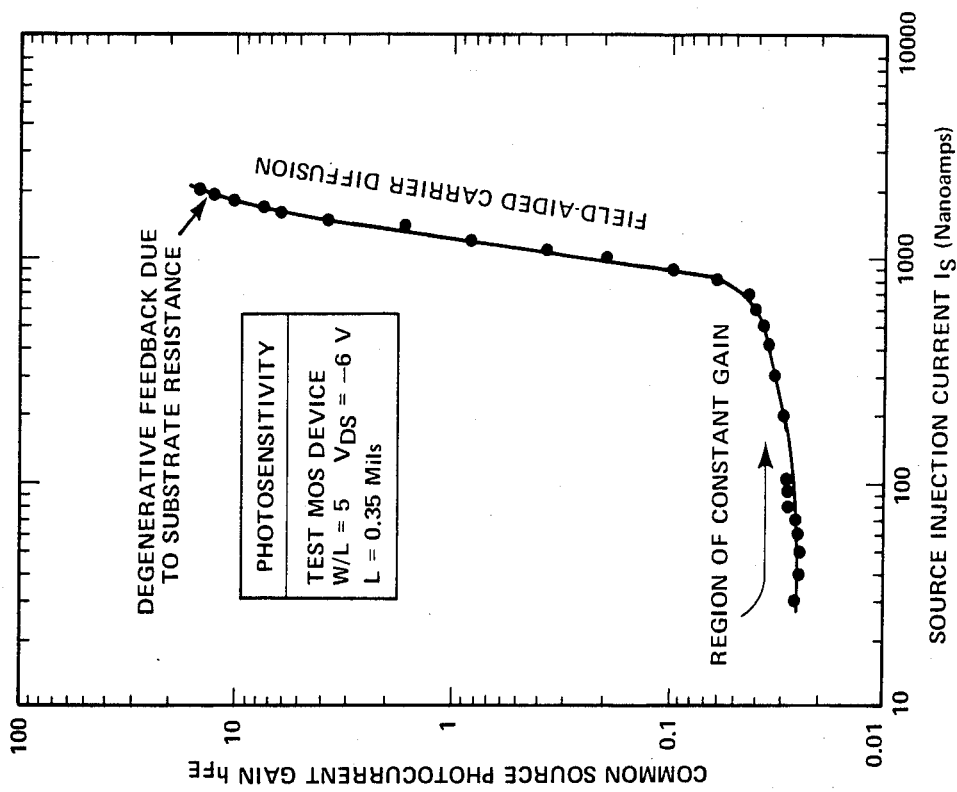
FIG. 2 is a measure showing the common source photocurrent gain $h_{FE}$ plotted for source injection currents.

The characteristics of Equations 12 and 13 describe the device operation at low nanoamp levels over the first decade and half of injection current $I_S$. Data similar to those plotted in FIG. 2 is used to determine the low-level $h_{FE}$ for a group of test devices in the plot of FIG. 3. In FIG. 3 the photosensitivity $S_{nom}$ values (dynamic) obtained from 1.8 MHz clocking on the array tester are plotted against the lateral gain $h_{FE}$ values (static measurements). Specifically, the data used for the gain $h_{FE}$ abscissa values in FIG. 3 are for $I_S = 80$ namp within the constant $h_{FE}$ region of minimum E-field and gain modulation effects.

The semiconductor devices of the present invention contain dimensions similar to those contained within the active photoabsorption volume described in the theory above. The carrier charge transport in the semiconductor device is mainly in a direction parallel to the semiconductor surface. Injection of minority charge carriers is caused by a forward-biased p-n diode junction to simulate the effect of photon absorption.

Figure 4A:
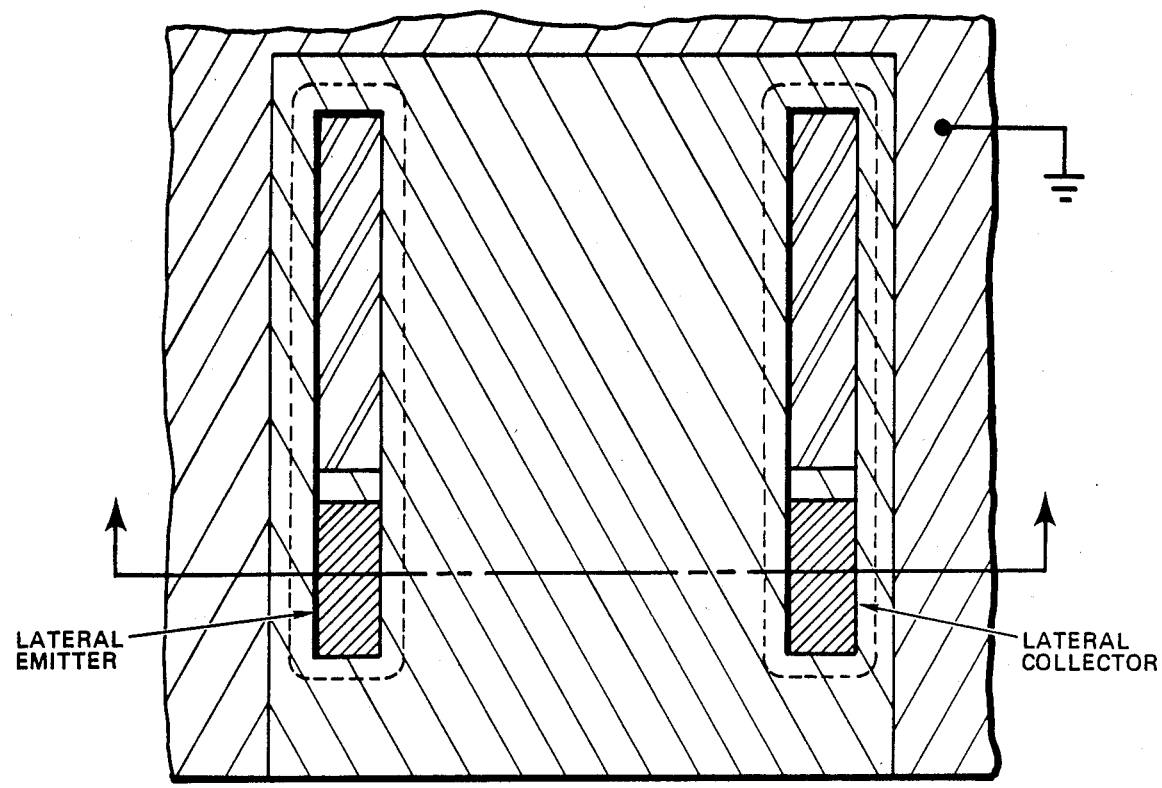
FIGS. 4a and 4b illustrate one possible configuration of a test device.
Figure 4B:
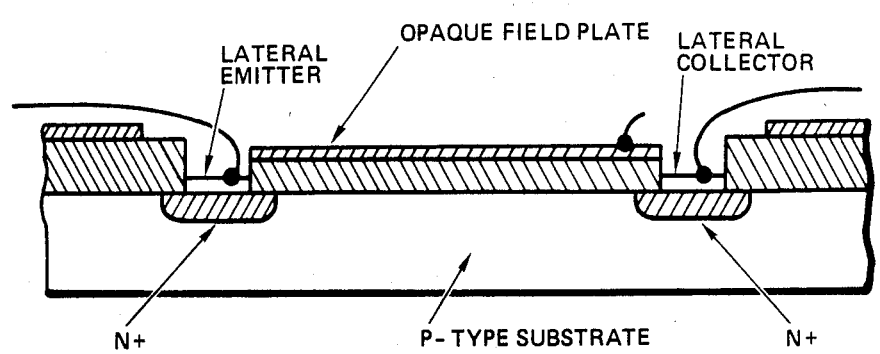

The lateral device structure uses an injection source of carriers and a collection diode with a spatial separation between the two adjusted to simulate the corresponding photodiode array. The device structure using a rectangular mask layout is shown in FIGS. 4a and 4b with a normal view and in transverse, cross-section. The emitter or source of carriers is spaced sufficiently from the reverse-biased collector junction diode. The emitter diode, forward biased serves as a source of minority carries to emulate the photogeneration function. The reverse-biased collector diode depletion region receives those carriers of sufficient diffusion length to move from the emitter to collector. The entire structure requires a photo-opaque shield to remove and eliminate the effects of ambient photo illumination. The field gate serve as both the opaque photoshield, and an electrostatic field plate to reduce lateral (parallel to semiconductor surface) electric fields between emitter and collector. In FIG. 4b a typical impurity profiling is shown with a p-type substrate. Electrical contacts are provided to the lateral emitter, lateral collector and substrate.

Figure 5A:
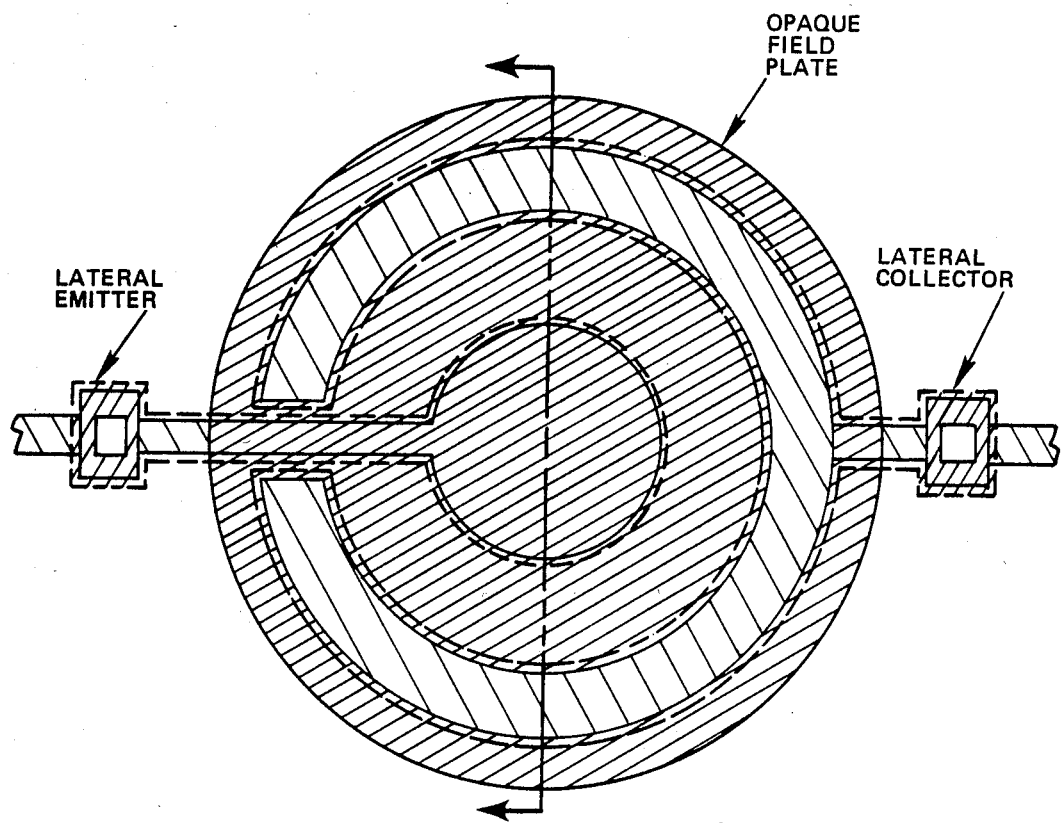
FIGS. 5a and 5b is another example of a test device of the present invention.
Figure 5B:
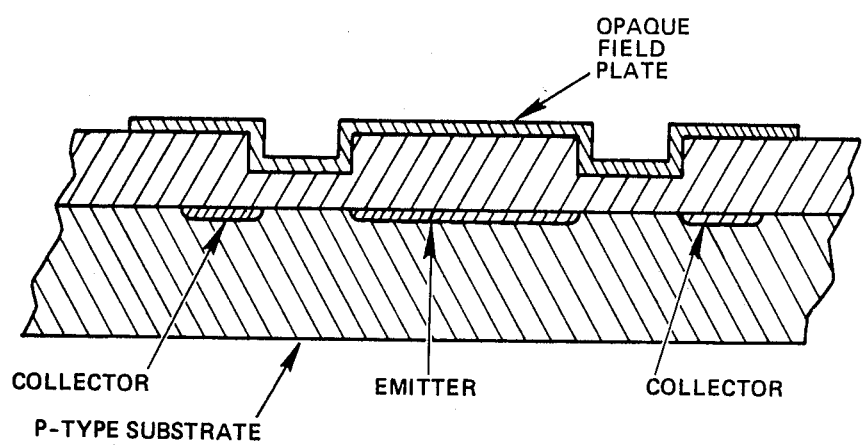

A similar embodiment is pictured with a top view and cross-section in FIGS. 5a and 5b with a circular patterned device. The device of FIGS. 5a and 5b is operated similarly to the device of FIGS. 4a and 4b. A field plate covering the entire area in proximity to the device serves to mask and remove light from the proximal semiconductor volume and to reduce the electric lateral field component between emitter and collector. The spacing between emitter and collector is greater than the diffusion length for minority carriers moving in the semiconductor without electric fields. The conductive gate is connected to circuit ground.

The measurements of current $I_C$ transferred between emitter and collector regions of devices similar to those of FIGS. 4 and 5 are correlated with the photosensitivity of integrated photosensors on the same semiconductor wafers in the linear regression of FIG. 3. Data for the abscissa plot was obtained using static (low speed) measurement of the $I_C/I_E$ ratio with test devices. Data for the ordinate plot was obtained using highly uniform illumination and circuit clocking at 2 MHz with the full integrated photosensor array packaging. The data in FIG. 3 shows a strong correlation between the static measured values of $I_C/I_E$ with the subject devices and a dynamic photosensitivity of the fully integrated photosensor circuit.

Having described a preferred embodiment of the invention, further embodiments and modifications will be suggested to those skilled in the art, which embodiments and modifications are deemed to be within the scope of the invention as defined in the following claims.

What is claimed is:

1. A method of determining the output current of a photodiode array fabricated on a semiconductor wafer comprising the steps of:
   forming on the semiconductor wafer a field effect transistor having source, gate, and drain electrodes;
   forming an opaque shield over the field effect transistor to prevent ambient light from affecting the drain current of the field effect transistor;

injecting a source current at the source electrode of the field effect transistor and measuring a drain current at the drain electrode of the field effect transistor; and determining a nominal output current for the photodiode array by correlating the measured drain current of the field effect transistor with the nominal photodiode output current.

2. The method of claim 1 wherein the field effect transistor gate electrode reduces lateral electric fields between the source electrode and the drain electrode.

3. The method of claim 2 wherein the gate electrode forms the opaque shield to shield the field effect transistor from ambient light.

* * * * *